United States Patent
Koh et al.

(10) Patent No.: US 9,317,629 B1
(45) Date of Patent: Apr. 19, 2016

(54) AUTOMATIC COMPARISON AND PERFORMANCE ANALYSIS BETWEEN DIFFERENT IMPLEMENTATIONS

(75) Inventors: David Koh, Boston, MA (US); Brian K. Ogilvie, Holliston, MA (US)

(73) Assignee: The MathWorks, Inc., Natick, MA (US)

( * ) Notice: Subject to any disclaimer, the term of this patent is extended or adjusted under 35 U.S.C. 154(b) by 0 days.

(21) Appl. No.: 12/765,324

(22) Filed: Apr. 22, 2010

Related U.S. Application Data

(62) Division of application No. 11/321,919, filed on Dec. 29, 2005.

(51) Int. Cl.
| | | |
|---|---|---|
| *G06G 7/48* | (2006.01) | |
| *G06F 17/50* | (2006.01) | |
| *G06F 11/36* | (2006.01) | |

(52) U.S. Cl.
CPC ........ *G06F 17/5009* (2013.01); *G06F 11/3668* (2013.01)

(58) Field of Classification Search
CPC ............ G06F 17/5009; G06F 17/3668; G06F 2207/7271
USPC .......................................................... 703/6
See application file for complete search history.

(56) References Cited

U.S. PATENT DOCUMENTS

| | | | |
|---|---|---|---|
| 5,819,071 A | 10/1998 | Mazer | |
| 5,838,948 A | 11/1998 | Bunza | |
| 5,857,091 A | 1/1999 | Fernandes et al. | |
| 5,870,585 A | 2/1999 | Stapleton | |
| 6,148,323 A | 11/2000 | Whitner et al. | |
| 6,285,914 B1 | 9/2001 | Bae et al. | |
| 6,385,765 B1 | 5/2002 | Cleaveland et al. | |
| 6,625,759 B1 | 9/2003 | Petsinger et al. | |
| 6,675,310 B1 | 1/2004 | Bloom et al. | |
| 6,728,913 B1 | 4/2004 | Parker | |
| 6,751,583 B1 | 6/2004 | Clarke et al. | |
| 6,922,819 B2 | 7/2005 | Visweswariah | |
| 6,922,821 B1 * | 7/2005 | Nemecek | 716/136 |

(Continued)

OTHER PUBLICATIONS

Ingo Sturmer et al., "Overview of existing safeguarding techniques for automatically generated code," Jul. 2005, ACM Sigsoft Software Engineering Notes, vol. 30, issue 4, pp. 1-6.*

(Continued)

*Primary Examiner* — Kamini S Shah
*Assistant Examiner* — Russ Guill
(74) *Attorney, Agent, or Firm* — Cesari and McKenna LLP; Michael R. Reinemann

(57) ABSTRACT

The present invention provides a method and system for automatic verification of automatically generated standalone code intended for execution on a target computing platform against its original design simulated in a simulation environment. The present invention also applies to execution comparisons between two implementations, such as two simulations, one simulation and one standalone code implementation, or two standalone code implementations. Block diagrams can be used to create a comparison model that compares two implementations. The comparison of different implementations can be performed at a block level, a sub-system level, a model level, or multi-model level. The present invention allows automatic comparison once a user supplies the intermediate outputs and/or signals that the user wants to compare and monitor. Reports can be generated to show the statistics of the comparison results.

29 Claims, 8 Drawing Sheets

(56) References Cited

U.S. PATENT DOCUMENTS

| | | | |
|---|---|---|---|
| 7,076,420 | B1 | 7/2006 | Snyder et al. |
| 7,139,936 | B2 | 11/2006 | Petsinger et al. |
| 7,447,621 | B1 | 11/2008 | Lam et al. |
| 7,606,695 | B1 | 10/2009 | Nouri et al. |
| 2003/0135790 | A1 | 7/2003 | Pignol |
| 2004/0006722 | A1 | 1/2004 | Safford |
| 2004/0044990 | A1 | 3/2004 | Schloegel et al. |
| 2005/0210433 | A1 | 9/2005 | Clarke et al. |
| 2006/0225008 | A1* | 10/2006 | Schleicher et al. ............ 716/3 |
| 2007/0109903 | A1 | 5/2007 | Motamedi |
| 2008/0098349 | A1 | 4/2008 | Lin et al. |

OTHER PUBLICATIONS

Andrew Burnard, "Verifying and Validating Automatically Generated Code," Jun. 2004, International Automotive Conference, eight unnumbered pages.*

Mirko Conrad et al., "Automatic evaluation of ECU software tests," 2005, Society of Automotive Engineers, ten unnumbered pages.*

Victor A. Skormin, "Application of the model reference approach in laser beam steering systems," 1997, Rome laboratory, pp. 1-78.*

Zhongshan Wu, "Simulation study and instability of adaptive control," 2001, Louisiana State University and Agricultural and Mechanical College, pp. 1-67.*

Hoang Le-Huy, "Modeling and simulation of electrical drives using MATLAB/Simulink and Power System Blockset," 2001, 27th Annual Conference of the IEEE Industrial Electronics Society, pp. 1603-1611.*

Indradeep Ghosh et al., "Design for verification at the register transfer level," 2002, Proceedings of the 15th International Conference on VLSI Design, six pages.*

G.N. Vanderplaats, "ADS—a fortran program for automated design synthesis," 1987, Engineering Design Optimization, Inc., 57 pages.*

"Simulink: Model-Based and System-Based Design," Using Simulink: Version 5, The MathWorks, Inc., Jul. 2002, (see entire document, especially pp. 14-13 to 14-20).

Marines Puig-Medina et al., "Verification of configurable processor cores", 2000, Proceedings of the 37th conference on design automation, pp. 426-431.

Taekyoon Ahn et al., "Design verification by concurrent simulation and automatic comparison", 1997, Proceedings of the 40th Midwestern Circuits and Systems, pp. 1087-1090.

Matthew Ownby et al., "A design methodology for implementing DSP with Xilinx System Generator for Matlab", 2003, Proceedings of the 35th Southeastern Symposium on System Theory, pp. 404-408.

James Hwang et al., "System Level Tools for DSP in FPGAs", 2001, in Field-Programmable Logic and Applications, Springer-Verlag, pp. 534-543.

Joonseo Vim et al., "Design verification of complex microprocessors", 1996, IEEE Asia Pacific Conference on Circuits and Systems, pp. 441-448.

S. Taylor et al., "Functional verification of a multiple-issue, out-of-order, superscalar Alpha processor—the DEC Alpha 21264 Microprocessor", 1998, Proceedings of the 1998 design Automation Conference, pp. 638-643.

N. Dohm et al., "Zen and the art of Alpha verification", 1998, Proceedings of the International Conference on VLSI in Computers and Processors, seven unnumbered pages.

William A. Johnson et al., "Mixed-level simulation from a hierarchical CHDL", 1980, ACM SIGDA Newsletter, vol. 10, Issue 1, pp. 2-10.

J. Sosnowski et al., "Pseudorandom versus deterministic testing of Intel 80×86 processors", 1996, Proceedings of the $22^{nd}$ Euromicro conference, pp. 329-336.

Barry W. Johnson, "Design and analysis of fault-tolerant digital systems", 1989, Addison-Wesley, pp. 169-200.

Brian Richards et al., "DSP system design using the BEE hardware emulation environment", Nov. 2003, Conference Record of Asilomar Conference on Signals, Systems, and Computers, pp. 895-899.

"Xilinx System Generator v2.1 for Simulink", 2002, pp. 1-148.

Artur Krukowski et al., "SimulinklMatlab-to-VHDL Route for full-custom/FPGA rapid prototyping of DSP algorithms", 1999, Matlab DSP Conference (Tampere, Finland), pp. 1-10.

S. Mu et al., "Mixed-signal modeling using Simulink based-C", Sep. 2005, Proceedings of the 2005 IEEE International Behavioral Modeling and Simulation Workshop, pp. 128-133.

G. Brandmayr et al., "Automatic co-verification of FPGA designs in Simulink", Jun. 8, 2005, Model-Based Design Conference 2005, ten unnumbered pages.

U.S. Appl. No. 11/321,919, filed Dec. 29, 2005 by David Koh et al. for an Automatic Comparison and Performance Analysis Between Different Implementations, all pages.

Ingo Sturmer et al., "Overview of existing safeguarding techniques for automatically generated code," ACM Sigsoft Software Engineering Notes, vol. 30, issue 4, Jul. 2005, pp. 1-6.

Andrew Burnard, "Verifying and Validating Automatically Generated Code," International Automotive Conference, Jun. 2004, pp. 1-8.

Mirko Conrad et al., "Automatic evaluation of ECU software tests," Society of Automotive Engineers, Apr. 2005, pp. 1-10.

Ekstrom, Per-Anders, "Eikos A Simulation toolbox for Sensitivity Analysis," Feb. 2005, Upsala Universtet, 57 pages.

Rogers, Kurt D., "Acceleration and implementation of a DSP phase-based frequency estimation algorithm Matlab/Simulink to FPGA via Xilinx system generator," Binghamton University, 2001, pp. 1-173.

Bhowmick, S. et al., "Faster PDE-based Simulations Using robust Composite Linear Solvers," 2004, Future Generation Computer Systems, vol. 20, pp. 373-387.

Jean-Francois et al., "Using Matlab and Simulink in a SystemC verification environment," Feb. 2005, Proceedings of the Design and Verification Conference DVCon05, 8 pages.

Chen Chang et al., "Rapid design and analysis of communication systems using the BEE hardware emulation environment," 2003, Proceedings of the 14th IEEE International Workshop on Rapid Systems Prototyping, seven pages.

"Communications Toolbox," 2002, The MathWorks, 409 pages.

Distefano, Joseph J., et al., "Schaum's Outline of Theory and Problems of Feedback and Control Systems," second edition, 1990, p. 157.

Mulpur, Arun, "Use Co-Simulation for the Functional Verification of RTL Implementations," Mar. 2005, 7 pages.

Nickel, Ulrich, "The Fujaba environment", In Proceedings of the $22^{nd}$ International Conference on Software Engineering (ICSE '00), ACM, New York, NY, USA, 2000, pp. 742-745.

PSpice User's Guide, 2000, Cadence Design Systems, 610 pages.

Smith, Jon M., "Mathematical Modeling and Digital Simulation for Engineers and Scientists," second edition, 1987, John wiley & Sons, pp. 172 & 174.

* cited by examiner

AUTOMATIC COMPARISON AND PERFORMANCE ANALYSIS BETWEEN DIFFERENT IMPLEMENTATIONS

CROSS REFERENCE TO RELATED APPLICATIONS

This application is a divisional of application Ser. No. 11/321,919 filed Dec. 29, 2005 by David Koh and Brian K. Ogilvie for an Automatic Comparison and Performance Analysis Between Different Implementations, which is hereby incorporated by reference in its entirety.

TECHNICAL FIELD

The present invention generally relates to technical computing, and, more particularly, to comparison and verification among execution of at least two simulations, at least two standalone code implementations, or at least one simulation and one standalone code implementation.

BACKGROUND OF THE INVENTION

Block diagrams are used to model real-world systems. Historically, engineers and scientists have utilized time-based block diagram models in numerous scientific areas, such as Feedback Control Theory and Signal Processing to study, design, debug, and refine dynamic systems. Dynamic systems, which are characterized by the fact that their behaviors change over time, are representative of many real-world systems. A dynamic system (either natural or man-made) is a system whose response at any given time is a function of its input stimuli, its current state, and the current time. Such systems range from simple to highly complex systems. Physical dynamic systems include, for example, a falling body, the rotating earth, biomechanical systems (muscles, joints, etc.), biochemical systems (gene expression, protein pathways), and weather and climate pattern systems. Examples of man-made or engineered dynamic systems include: a bouncing ball, a spring with a mass tied on an end, automobiles, airplanes, control systems in major appliances, communication networks, audio signal processing, nuclear reactors, and a stock market.

A block diagram model of a dynamic system is represented schematically as a collection of blocks interconnected by lines that represent signals. Each block represents an elemental dynamic system. A signal represents either the input or the output of a dynamic system. A line emanating at one block and terminating at another signifies that the output of the first block is an input to the second block. Each distinct input or output on a block is referred to as a "port". Signals correspond to the time-varying quantities represented by each line connection and are assumed to have values at each time instant at which the connecting blocks are enabled. The source block of a signal writes to the signal at a given time instant when its system equations are solved. The destination blocks of this signal read from the signal when their system equations are being solved.

It should be noted that the term "block diagram," as used herein, also refers to other graphical modeling formalisms. For instance, flow-charts are block diagrams of entities that are connected by relations. Flow-charts are used to capture process flow and are not generally suitable for describing dynamic system behavior. Data flow block diagrams are diagrams of entities with relations between them that describe a graphical programming paradigm where the availability of data is used to initiate the execution of blocks, where a block represents an operation and a line represents execution dependency describing the direction of data flowing between blocks. It will be appreciated that a block diagram model may include entities that are based on other modeling domains within the block diagram. A common characteristic among these various forms of block diagrams is that they define semantics on how to execute them.

In graphical modeling environments, such as model-based design tools, block diagram models can be created to represent a design, or algorithm, of an implementation for a computational hardware. One or more block diagram models may represent a design for a target hardware platform. A target hardware platform used in this application may include a single computing platform or multiple computing platforms. A target hardware platform may also have other elements such as memory, interfaces, or other integrated circuits (ICs). An automatic code generation application can automatically generate code and build programs from the block diagram model for implementation on the target hardware platform based on the design specified by the model. In this manner, the design of a block diagram model behaves as an implementation specification for automatic code generation. A graphical block diagram modeling environment can be used to produce designs and algorithms that can be implemented on a processor or computational IC, such as field-programmable gate array (FPGA) or application-specific integrated circuit (ASIC).

Historically, after code for a target hardware platform is automatically generated from a block diagram model and embedded in the target hardware platform, there has been no easy way to verify if the automatic generated code will execute in the target hardware platform just as designed by the block diagram model.

SUMMARY OF THE INVENTION

The present invention provides a method and system for automatic verification of automatically generated standalone code intended for execution on a target computing platform against its original design simulated in a simulation environment. The present invention applies to execution comparisons between two implementations, where the two implementations can be two simulations, one simulation and one standalone code implementation, or two standalone code implementations. Comparison of different implementations can be performed at different levels by allowing comparison of intermediate outputs of the different implementations. The present invention allows automatic comparison once a user identifies the intermediate outputs and/or signals that the user wants to compare and monitor. Reports can be generated to show the statistics of the comparison results. In one aspect of the present invention, a block diagram can be used to represent a comparison model that compares implementations. The comparison can be done at a block level, a subsystem level, a model level, or a multi-model level.

In one embodiment of the present invention, a computer-implemented method for automatically comparing a first simulation with a second simulation is provided. The method includes the steps of providing a first simulation and providing a second simulation. A first intermediate output is identified from the first simulation and a second intermediate output from the second simulation. The first simulation and the second simulation are instructed to execute simultaneously in a locked-step manner. At least one value of the first intermediate output is compared with at least one value of the second intermediate output during execution of the first and second simulations.

In one aspect of the present invention, the execution of the first simulation and the execution of the second simulation may be on different host computers. In still another aspect of the present invention, the method further comprises the steps of identifying a third intermediate output from the first simulation and a fourth intermediate output from the second simulation. At least one value of the third intermediate output is compared with at least one value of the fourth intermediate output during execution of the first and second simulations. The first and second simulations can be represented using one or more blocks in a comparison block diagram model. The third intermediate output may be an output of a first block using the first intermediate output as an input and the fourth intermediate output may be an output of a second block using either the second intermediate output or the first intermediate output as an input.

In yet another aspect of the present invention, the method further comprises the step of receiving comparison instructions specifying at least one of or a combination of a number of test runs, a range of system input sources, a range of subsystem-level design parameter values, a range of independent subsystem-level error tolerances, a range of accumulated subsystem-level error tolerances, and a range of reporting metrics and formats.

In still another aspect of the present invention, the method also includes the step of generating a comparison report comparing execution results of the first and second simulations. The report can include statistics on at least one of or a combination of an error rate, an error distribution, and a sensitivity metrics.

In yet another aspect of the present invention, the error rate is at least one of or a combination of a mean time before error, a mean time between errors, a rate of error per time, a rate of error per run, and other error frequency metrics.

In a further aspect of the present invention, the sensitivity metrics describes at least one of or a combination of an independent subsystem level sensitivity to subsystem input, an accumulated subsystem-level sensitivity to application input, an independent subsystem-level sensitivity to subsystem parameters, an accumulated subsystem-level sensitivity to parameters.

In still another aspect of the present invention, the method can further include the step of automatically generating a comparison model to compare the first simulation with the second simulation.

In another embodiment of the present invention, a computer implemented method for comparing execution of a standalone code implementation and a simulation is provided. A first intermediate output in the simulation and a second intermediate output in the standalone code implementation are identified. The simulation and the standalone code implementation are instructed to execute simultaneously in a locked-step manner. At least one value of the first intermediate output is automatically compared with at least one value of the second intermediate output during execution of the simulation and the standalone code implementation.

The standalone code implementation may be implemented in many different programming languages, such as a hardware description language (HDL) and C.

The method may further include the steps of executing the simulation on a host computer and executing the standalone code implementation on a computing platform. The method may also include the step of sending instructions from the host computer to the computing platform to execute the standalone code implementation.

The standalone code implementation may be automatically generated from a design using information regarding the computing platform, wherein the design is simulated by the simulation. The standalone code and the simulation may be represented using one or more blocks in a comparison block diagram model. At least one block in the comparison block diagram model may bi-directionally communicate with the computing platform. The method may further include the step of identifying a third intermediate output from the simulation and a fourth intermediate output from the standalone code implementation. The method may also include the step of comparing at least one value of the third intermediate output with at least one value of the fourth intermediate output during execution of the simulation and the standalone code implementation. The third intermediate output may be an output of a first block using the first intermediate output as an input and the fourth intermediate output may be an output of a second block using either the second intermediate output or the first intermediate output as an input.

The method may further include the step of receiving comparison instructions specifying at least one of or a combination of a specified number of test runs, a range of system input sources, a range of subsystem-level design parameter values, a range of independent subsystem-level error tolerances, a range of accumulated subsystem-level error tolerances, and a range of reporting metrics and formats. The method may further include the step of generating a comparison report comparing the simulation and the standalone code implementation. The report includes statistics on at least one of or a combination of an error rate, an error distribution, and a sensitivity metrics. The error rate may be at least one of or a combination of a mean time before error, a mean time between errors, a rate of error per time, a rate of error per run, and other error frequency metrics. The sensitivity metrics may describe at least one of or a combination of an independent subsystem level sensitivity to subsystem input, an accumulated subsystem-level sensitivity to application input, an independent subsystem-level sensitivity to subsystem parameters, an accumulated subsystem-level sensitivity to parameters.

The method may also further include the step of automatically generating a comparison model comparing the simulation and the standalone code implementation.

In still another embodiment of the present invention, a method for automatically comparing execution of generated HDL code, such as VHDL, Verilog, SystemC, System Verilog, and the like, synthesized for a computing platform and a simulation on a host computer is provided. The computing platform can be an FPGA or ASIC target device. The method includes the steps of providing a simulation and providing. standalone HDL code synthesized for a computing platform. A first intermediate output in the simulation and a second intermediate output in the HDL code are identified, The simulation on the host computer is simultaneously executed with the standalone code on the computing platform in a locked-step manner. At least one value of the first intermediate output is automatically compared with at least one value of the second intermediate output during execution of the simulation and the standalone HDL code. The method may further include the step of automatically generating a comparison model comparing the simulation and the standalone HDL code.

In yet another embodiment of the present invention, a method for automatically comparing execution of a simulation on a host computer and generated hardware description language (HDL) code simulated in an HDL simulator is provided. The method includes the steps of providing a simulation and providing HDL code for the HDL simulator. A first intermediate output in the simulation and a second intermediate output in the HDL code are identified. The simulation on the host computer is simultaneously executed with the HDL code on an HDL simulator in a locked-step manner. At least one value of the first intermediate output is automatically compared with at least one value of the second intermediate output during execution of the simulation and the standalone HDL code. The method may further include the step of automatically generating a comparison model comparing the simulation and the standalone HDL code.

In still another embodiment of the present invention, a method for automatically comparing execution of a first standalone code implementation and a second standalone code implementation is provided. A first intermediate output of the first standalone code implementation and a second intermediate output of the second standalone code implementation are identified. The first standalone code implementation and the second standalone code implementation are instructed to execute simultaneously in a locked-step manner. At least one value of the first intermediate output is automatically compared with at least one value of the second intermediate output during execution of the first and second standalone code implementations.

The first standalone code implementation may execute on a first computing platform and the second standalone code implementation may execute on a second computing platform. The comparison of the at least one value of the first intermediate output and the at least one value of the second intermediate output can be performed on a host computer. Each of the first and second computing platforms may have an operating system. The first computing platform and/or second computing platform may be external to the host computer. The first and second standalone code implementations may be represented as one or more blocks in a comparison block diagram model on the host computer. At least one block in the comparison block diagram model may bidirectionally communicate between the host computer and at least one of or a combination of the first and second computing platforms. The "method may further include the steps of identifying a third intermediate output from the first standalone code implementation and a fourth intermediate output from the second standalone code implementation and comparing at least one value of the third intermediate output with at least one value of the fourth intermediate output during execution of the first and second the standalone code implementations. The third intermediate output may be an output of a first block using the first intermediate output as an input and the fourth intermediate output may be an output of a second block using either the second intermediate output or the first intermediate output as an input. The method may further include the step of receiving comparison instructions specifying at least one of or a combination of a specified number of test runs, a range of system input sources, a range of subsystem-level design parameter values, a range of independent subsystem-level error tolerances, a range of accumulated subsystem-level error tolerances, and a range of reporting metrics and formats. The method may further include the step of generating a comparison report comparing the first and second standalone code implementations. The report can include statistics on at least one of or a combination of an error rate, an error distribution, and a sensitivity metrics. The error rate may be at least one of or a combination of a mean time before error, a mean time between errors, a rate of error per time, a rate of error per run, and other error frequency metrics. The sensitivity metrics may describe at least one of or a combination of an independent subsystem level sensitivity to subsystem input, an accumulated subsystem-level sensitivity to application input, an independent subsystem-level sensitivity to subsystem parameters, an accumulated subsystem-level sensitivity to parameters.

The method may further include the step of automatically generating a comparison model to compare the first standalone code implementation and the second standalone code implementation.

In yet another embodiment of the present invention, a computer-readable medium storing instructions for causing a computing device to automatically compare a first simulation with a second simulation is provided. A first intermediate output from the first simulation and a second intermediate output from the second simulation are identified. The first simulation and the second simulation are instructed to execute in a locked-step manner. At least one value of the first intermediate output is automatically compared with at least one value of the second intermediate output during execution of the first and second simulations.

In still another embodiment of the present invention, a computer-readable medium storing instructions for causing a computing device to automatically compare execution of a standalone code implementation and a simulation is provided. A first intermediate output in the simulation and a second intermediate output in the standalone code implementation are identified. The simulation and the standalone code implementation are instructed to execute simultaneously in a locked-step manner. At least one value of the first intermediate output is automatically compared with at least one value of the second intermediate output during execution of the simulation and the standalone code implementation.

In yet another embodiment of the present invention, a computer-readable medium storing instructions for causing a computing device to automatically compare execution of a first standalone code implementation and a second standalone code implementation is provided. A first intermediate output in the first standalone code implementation and a second intermediate output in the second standalone code implementation are identified. The first standalone code implementation and the second standalone code implementation are instructed to execute simultaneously in a locked-step manner. At least one value of the first intermediate output is automatically compared with at least one value of the second intermediate output during execution of the first and second standalone code implementations.

In still another embodiment of the present invention, a system for instructing more than one simulation to execute simultaneously in a locked-step manner is provided. The system includes a concurrent execution environment and a comparison mechanism that is capable of comparing executions of more than one simulation. The system also includes a communication control communicating instructions from the concurrent execution environment to an external process and communicating data to and from the external process.

In yet another embodiment of the present invention, a system for instructing a simulation and a standalone code implementation to execute simultaneously in a locked-step manner is provided. The system includes a concurrent execution environment and a comparison mechanism that is capable of comparing executions of the simulation and the standalone code implementation. The system also includes a communication control communicating instructions from the concurrent execution environment to an external computing platform and communicating data to and from the external computing platform.

In still another embodiment of the present invention, a system for simultaneously executing more than one standalone code implementation in a locked-step manner is provided. The system includes a concurrent execution environment and a comparison mechanism that is capable of comparing executions of more than one standalone code implementation. The system also includes a communication control communicating instructions from the concurrent execution environment to an external computing platform and communicating data to and from the external computing platform.

In yet another embodiment of the present invention, a system for instructing more than one simulation to execute simultaneously in a locked-step manner is provided. The system includes means for identifying a first intermediate output from the first simulation and a second intermediate output from the second simulation and means for instructing the first simulation and the second simulation to execute simultaneously in a locked-step manner. The system also includes means for automatically comparing at least one value of the first intermediate output with at least one value of the second intermediate output during execution of the first and second simulations.

In still another embodiment of the present invention, a system for instructing a simulation and a standalone code implementation to execute simultaneously in a locked-step manner is provided. The system includes means for identifying a first intermediate output in the simulation and a second intermediate output in the standalone code implementation and means for instructing the simulation and the standalone code implementation to execute simultaneously in a locked-step manner. The system also includes means for automatically comparing at least one value of the first intermediate output with at least one value of the second intermediate output during execution of the simulation and the standalone code implementation.

In yet another embodiment of the present invention, a system for simultaneously executing more than one standalone code implementation in a locked-step manner is provided. The system includes means for identifying a first intermediate output in the first standalone code implementation and a second intermediate output in the second standalone code implementation and means for instructing the first standalone code implementation and the second standalone code implementation to execute simultaneously in a locked-step manner. The system also includes means for automatically comparing at least one value of the first intermediate output with at least one value of the second intermediate output during execution of the first and second standalone code implementations.

BRIEF DESCRIPTION OF THE FIGURES

The foregoing and other objects, aspects, features, and advantages of the invention will become more apparent and may be better understood by referring to the following description taken in conjunction with the accompanying drawings, in which.

DETAILED DESCRIPTION

Figure 1:
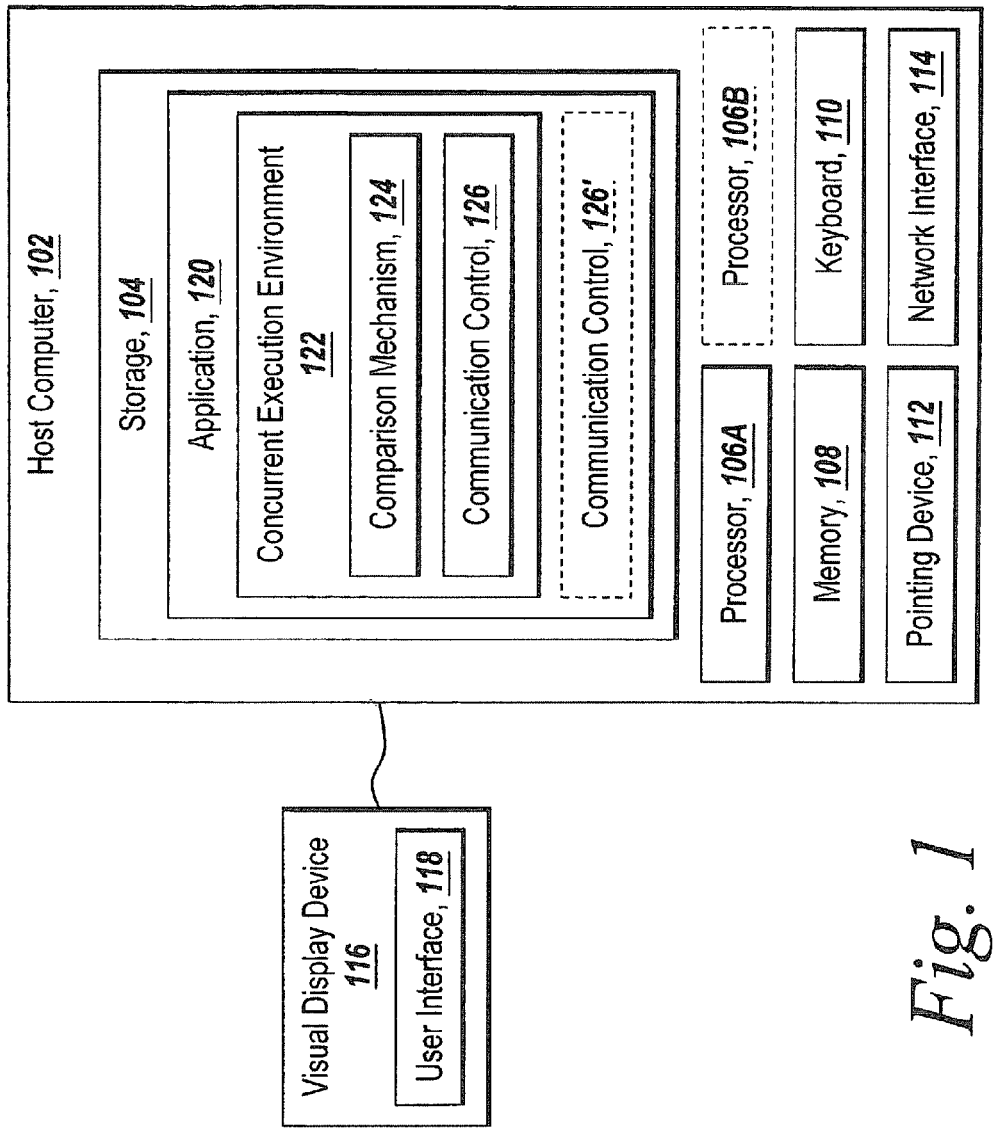
FIG. 1 is a block diagram of a computing device suitable for practicing an embodiment of the present invention.

For the purpose of discussion in this application, the following terms are given the following meaning in this application.

A processor includes, but not limited to, general purpose processor (GPP), microcontroller, and Digital Signal Processor (DSP).

A computational IC includes, but not limited to, FPGA, ASIC, programmable logic device (PLD), and programmable logic array (PLA).

A host computer is a computing device with a processor wherein the simulation environment, such as Simulink®, resides.

A computing platform is a processor, computational IC, an emulator of a processor, an emulator of a computational IC, a simulator of a processor, a simulator of a computational IC, or a combination thereof. An emulator or a simulator of a processor or a computation IC is a software emulation or software simulation that resides on a host computer.

The simulator allows execution of standalone code implementation, such as C code or HDL, intended for the processor or computation IC. Examples of a simulator includes, but not limited to, Trace32 from Lauderbach, C6000 DSP Simulator from Texas Instruments, and ModelSim HDL Simulator from Mentor Graphics.

A design is an algorithm for a hardware or software architecture, components, modules, interfaces to satisfy specified requirements.

A simulation is for execution on a computing device with a simulation environment such as MATLAB or Simulink® from Math Works, Inc.

A model executes within a simulation environment, such as MATLAB and Simulink®, on a host computer. A model can include, but not limited to, application design that can be executed in simulation, application design from which code can be automatically generated, communications interface with ail external computing platform.

A block diagram model is a graphical representation of a model using block diagrams. A single block diagram may represent a design for one or more computing platforms. On the other hand, one or more block diagram models may represent a design for a single computing platform.

A standalone code implementation is a standalone software that can be executed on a host computer or a computing platform.

An implementation is the realization of the intended design in simulation or a standalone code implementation. Examples of an implementation include, but are not limited to, a simulation of a design on a host computer, and execution of a standalone code implementation on a computing platform. One or more models can also be used to represent one implementation.

A subsystem is a hierarchical model abstraction that can include multiple blocks and other subsystems.

A parameter is a variable defined by an algorithm. For example, given a function $y=K*u$, where y is the output and u is the input, K is a parameter of the function that can be varied by a user manually or programmatically to determine what the function will be.

An intermediate output is an intermediate result of a simulation or execution of a standalone code implementation. For example, in a graphical block diagram modeling application, an intermediate output can be an output (or output signal) of a block within a block diagram model. In another example, in the execution of a standalone code implementation, an intermediate output can be an output of a function or execution results of a sequence of instructions. The present invention provides a method and system for comparing different implementations of one or more designs. An illustrative embodiment of the present invention provides a method and system for automatic verification of automatically generated standalone code implementation intended for execution on a target computing platform against its original simulation design from which the standalone code is generated. A user can use this verification to double check if the automatically generated code performs as predicted in the original simulation design. The illustrative embodiment relieves the user's burden to write manual code to communicate with the target computing platform and administer manual tests.

The present invention provides a method and system for comparing simultaneous executions of different implementations. A block, a collection of blocks, a subsystem, a model, or a collection of integrated models can be used to represent an implementation. Comparison of different implementations can be done at different levels. Comparison of only the final execution results of the different implementations is not always helpful as different components of the implementations can affect the final execution results. Hence, one advantage of the present invention is that a user can choose to compare intermediate outputs and choose how errors between the different implementations should be propagated, such as if an error at an earlier stage should be allowed to propagate to a later stage in the execution.

The present invention also provides a method and system for comparing simultaneous executions of standalone code implementations on the same or different computing platforms. A host computer can communicate with the one or more computing platforms that execute the standalone code implementations and instruct the computing platforms to execute the standalone code implementations simultaneously in a locked-step manner. A user can compare how one standalone code implementation performs on two different computing platforms, or how two different standalone code implementations perform on the same platform.

For example, when the computing platforms are external to the host computer, the present invention allows an application program on the host computer to communicate with the external computing platforms and instruct the simultaneous execution of the standalone code implementations and further retrieve and compare the executions results on the host computer. A user does not need to analyze data after execution of the standalone code implementations. The present invention may allow real-time analysis and comparison of two executions of standalone code implementations. One of ordinary skill in the art will appreciate there are many combinations and modifications one can make with the exemplary embodiments described herein but still does not depart from the spirit and scope of the present invention.

In a preferred embodiment of the present invention, a block diagram can be used to represent a comparison model that compares two implementations, such as two simulations, two standalone code implementations, or one simulation and one standalone code implementation. The comparison can be done at a block level, a subsystem level, a model level, or multi-model level. The present invention may allow automatic comparison once a user identifies the intermediate outputs and/or signals that the user wants to compare and monitor. Reports can be generated to show the statistics of the comparison results.

Illustrative embodiments will be described below for illustrative purposes relative to the technical computing environment of MAT LAB and Simulink® from The MathWorks, Inc. of Natick, Mass. Although the illustrative embodiments are described relative to a MathWorks-based application, one of ordinary skill in the art will appreciate that the present invention may be applied to other graphical modeling environments and technical computing environments, such as any technical computing environments using software products of Rhapsody from I-Logix Inc., TargetLink and Real-Time Interface from dSPACE GmbH, RT-LABTM from Opal-R'I' Technologies, Inc., EXITE from EXTESSY AG, LabVIEW®, MATRIXx from National Instruments, Inc., System'Vue" from Eagleware-Elanix Corporation, Mathematica® from Wolfram Research, Inc., Mathcad of Mathsoft Engineering & Education Inc., COSSAP from Synopsys, Inc., HyperSignal® from Hyperception, Inc., Dymola from Dynasim AB, or Maple" from Maplesoft, a division of Waterloo Maple Inc. Furthermore, one ordinarily skilled in the art will appreciate that the present invention may apply to any graphical modeling environment, such as one providing modeling with a Unified Modeling Language (UML), Hardware Description Language (HDL), or that provides a physics modeling domain. Additionally, those skilled in the art will also appreciate that the principles and concepts are equally applicable to non-graphical modeling applications as well.

FIG. 1 depicts an environment suitable for practicing an illustrative embodiment of the present invention. The environment includes a host computer 102 having memory 108, on which software according to one embodiment of the present invention may be stored, processor 106A, and optionally processor 106B, for executing software stored in the memory 108, and other programs for controlling system hardware. Each of the processors 106A and 106B can be a single or multiple core processor. Virtualization can be employed in host computer 102 so that infrastructure and resources in the computing device can be shared dynamically. Virtualized processors may also be used with application 120 and other software in storage 104. A virtual machine can be provided to handle a process running on multiple processors so that the process appears to be using only one computing resource rather than multiple. Multiple virtual machines can also be used with one processor. Other computing resources, such as FPGA, ASIC, DSP, and GPP, may also be used for executing code and/or software. A hardware accelerator can additionally be used to speed up the general processing rate of the host computer 102.

The memory 108 may comprise a computer system memory or random access memory such as DRAM, SRAM, EDO RAM, etc. The memory 108 may comprise other types of memory as well, or combinations thereof. A user may interact with the host computer 102 through a visual display device 116 such as a computer monitor, which may include a user interface 118. The host computer 102 may include other I/O devices such a keyboard 110 and a pointing device 112, for example a mouse, for receiving input from a user. Optionally, the keyboard 110 and the pointing device 112 may be connected to the visual display device 116. The host computer 102 may include other suitable conventional I/O peripherals. The host computer 102 may further comprise a storage device 104, such as a hard-drive or CD-ROM, for storing an operating system and other related software, and for storing application 120, such as Simulink®. Application 120 may include a concurrent execution environment 122 to enable concurrent execution and/or monitoring of simulations and/or standalone code implementations on the host computer 102. Concurrent execution environment 122 includes comparison mechanism 124 and communication control 126 (discussed later). Those skilled in the art will appreciate that communication control 126 is adaptable to be included as part of the application 120 or a stand alone application that responds to calls from the application 120, such as communication control 126'. Additionally, the application 120 can be run from a bootable CD, such as, for example, KNOPPIX®, a bootable CD for GNU/Linux.

Additionally, the host computer 102 may include a network interface 114 to interface to a Local Area Network (LAN), Wide Area Network (WAN) or the Internet through a variety of connections including, but not limited to, standard telephone lines, LAN or WAN links (e.g., 802.11, T1, T3, 56 kb, X.25), broadband connections (e.g., ISDN, Frame Relay, ATM), wireless connections, or some combination of any or all of the above. The network interface 114 may comprise a built-in network adapter, network interface card, PCMCIA network card, card bus network adapter, wireless network adapter, USB network adapter, modem or any other device suitable for interfacing the host computer 102 to any type of network capable of communication and performing the operations described herein. Moreover, the host computer 102 may be any computer system such as a workstation, desktop computer, server, laptop, handheld computer or other form of computing or telecommunications device that is capable of communication and that has sufficient processor power and memory capacity to perform the operations described herein.

The host computer 102 can be running any operating system such as any of the versions of the Microsoft® Windows® operating systems, the different releases of the Unix and Linux operating systems, any version of the MacOS® for Macintosh computers, any embedded operating system, any real-time operating system, any open source operating system, any proprietary operating system, any operating systems for mobile computing devices, or any other operating system capable of running on the computing device and performing the operations described herein.

Figure 2:
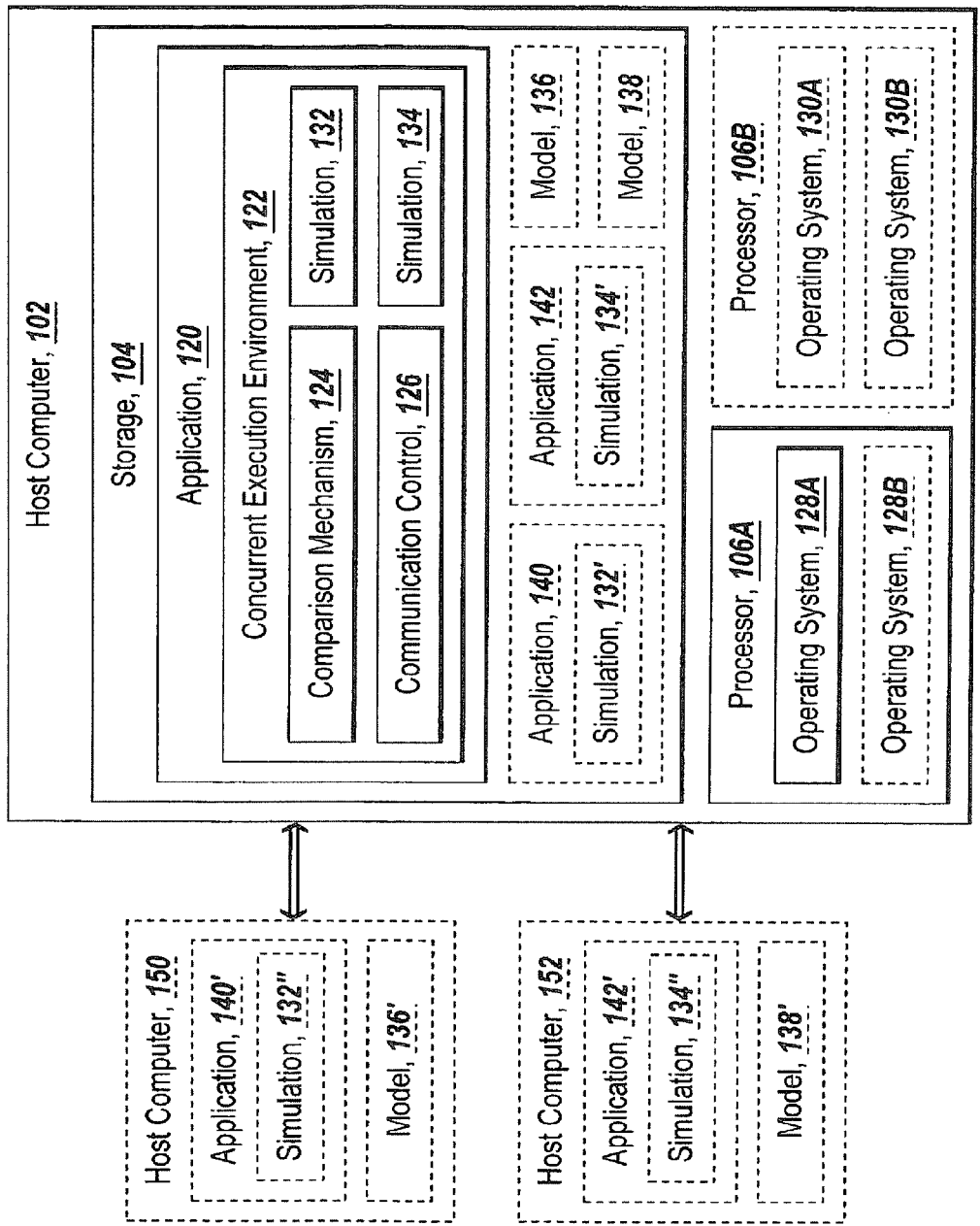
FIG. 2 illustrates a suitable system for practicing one embodiment of the present invention.

FIG. 2 depicts a suitable system for practicing one embodiment of the present invention. In one embodiment of the present invention, simulation 132 and simulation 134 are monitored and executed in the concurrent execution environment 122. Both simulation 132 and simulation 134 can run on processor 106A. Alternatively, simulation 132 can run on processor 106A and simulation 134 can run on processor 106B. Processor 106A can have operating system 128A and optionally operating system 128B. Processor 106B can have operating system 130A and optionally operating system 130B. Alternatively, both processor 106A and processor 106B share one operating system. Comparison mechanism 124 is capable of comparing simulation 132 and simulation 134 during execution of simulation 132 and simulation 134. In one aspect of the present invention, semantics of simulation 132 and simulation 134 can be described using model 136 and model 138, respectively. In a preferred embodiment of the present invention, model 136 and model 138 are block diagram models built by a block diagram modeling application, such as Simulink®. Hence, comparison mechanism 124 can compare simulation 132 and simulation 134 at a variety of different levels. For example, comparison mechanism 124 can compare an intermediate output or a block signal from model 136 with another intermediate output or block signal from model 138. Additionally, comparison mechanism 124 can compare output of a subsystem from model 136 with another subsystem from model 138. Furthermore, comparison mechanism 124 can compare a final output of the model 136 with a final output of the model 138. Model 136 and model 138 can also contain other smaller models. Additionally, comparison mechanism 124 can automatically generate a comparison model to compare the simulations 132 and 134. The comparison model may be implemented as a block diagram model, where one or more blocks are used to represent semantics of the simulation 132 and 134. In one embodiment of the present invention, model 136 and 138 are a submodel or subsystem of the comparison model.

In another embodiment of the present invention, comparison mechanism 124 can compare simulation 132 with simulation 132' that is executed by application 140. Application 140 can execute on the same or different processor that executes application 120. Application 140 can also be controlled by the same or different operating system as the one that controls application 120. Communication control 126 is capable of communicating between application 120 and application 140. Communication control 126 is also capable of controlling execution of simulation 132'. In other words, communication control 126 can determine when to execute, pause, or terminate the simulation 132'. Communication control 126 can also determine what inputs simulation 132' should use for execution. Communication control 126 can further determine if a portion or all of simulation 132' should be executed. Communication control 126 can issue instructions to cause simultaneous execution of simulation 132 and simulation 132' in a locked-step manner. Comparison mechanism 124 can automatically generate a comparison model to compare the simulation 132 with simulation 132'. The comparison model may be implemented as a block diagram model, where one or more blocks are used to represent semantics of the simulation 132 and 132'.

In a further embodiment of the present invention, comparison mechanism 124 can compare execution results of simulation 132' executing by application 140 and simulation 134' executing by application 142. Application 140 and application 142 can execute on the same or different processor and be controlled by the same or different operating system. Communication control 126 communicates with application 140 and application 142 regarding data related to simulation 132' and simulation 134' respectively. Communication control 126 can issue instructions to cause simultaneous execution of simulation 132' and simulation 134' in a locked step manner.

Semantics of simulation 132' and simulation 134' can be represented by model 136 and model 138 respectively. In a preferred embodiment of the present invention, model 136 and model 138 are built using a block diagram modeling application, such as Simulink®. Application 120 uses model 136 and model 138 in the concurrent execution environment to represent simulation 132' and simulation 134', respectively. Comparison mechanism 124 can request communication control 126 to obtain data from simulation 132' and/or simulation 134' for comparison purposes. Communication control 126 can make a function call to a specific portion of simulation 132' or simulation 134'. Comparison mechanism 124 can automatically generate a comparison model to compare the simulation 132' and simulation 134'. The comparison model may be implemented as a block diagram model, where one or more blocks are used to represent semantics of the simulation 134' and 132'.

In another aspect of the present invention, comparison mechanism 124 can compare simulation 132 or simulation 132' with simulation 132" that executes on application 140' which resides on host computer 150. Communication control 126 communicates between application 120 on host computer 102 and application 140' on host computer 150 regarding data related to simulation 132". Application 120 can use a model in concurrent execution environment 122 to represent semantics of simulation 132". The model can be stored locally in storage 104 or externally at host computer 150, such as model 136'. Comparison mechanism 124 can make a function call to a specific portion of simulation 132". Communication control 126 is also capable of controlling execution of simulation 132". In other words, communication control 126 can determine when to execute, pause, or terminate the simulation 132". Communication control 126 can also determine what inputs simulation 132" should use for execution. Communication control 126 can further determine if a portion or all of simulation 132" should be executed. Communication control 126 can issue instructions to cause simulation 132" and simulation 132 or simulation 132' to execute simultaneously in a locked-step manner. Comparison mechanism 124 can automatically generate a comparison model to compare the simulation 132" and simulation 132 or simulation 132'. The comparison model may be implemented as a block diagram model, where one or more blocks are used to represent semantics of the simulation 132" and simulation 132' or simulation 132.

In a further embodiment of the present invention, comparison mechanism 124 can compare execution of simulation 132" with execution of simulation 134". Simulation 134" can be executed by an application 142' on a host computer 152 that is different from host computer 150. Host computer 152 can also include a model 138' that application 120 uses to represent the semantics of simulation 134". Communication control 126 can issue instructions to cause simultaneous execution of simulation 132" and simulation 134" in a locked step manner. Comparison mechanism 124 can automatically generate a comparison model to compare the simulation 132" and simulation 134". The comparison model may be implemented as a block diagram model, where one or more blocks are used to represent semantics of the simulation 134" and 132".

One of ordinary skill in the art will appreciate that any type of simulation may be used in the present invention. Additionally, applications 120, 140, and 140' may be different applications, different instances of the same application, or a combination thereof.

Figure 3:
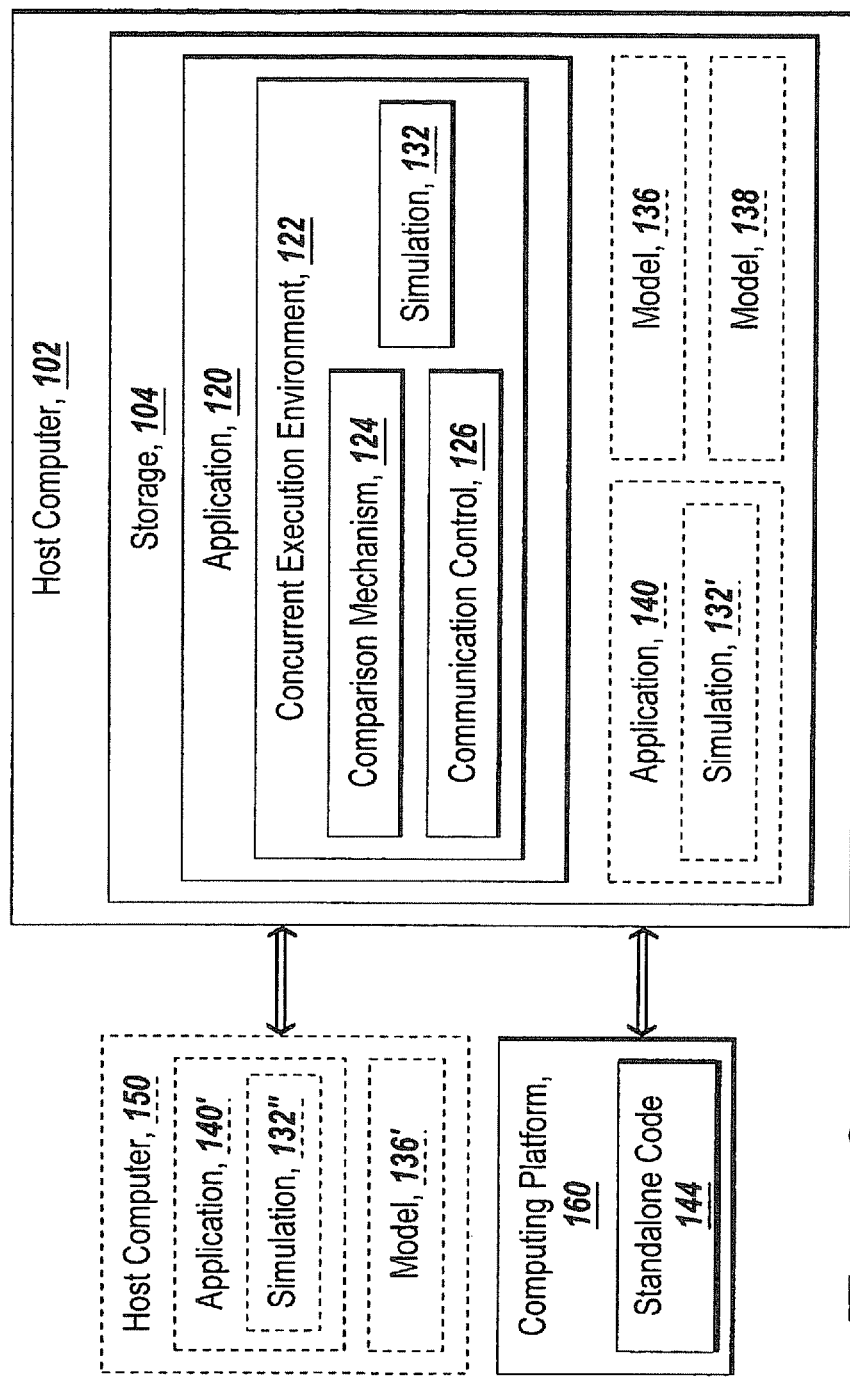
FIG. 3 illustrates a suitable system for practicing another embodiment of the present invention.

FIG. 3 depicts a suitable system for practicing another embodiment of the present invention. In this embodiment of the present invention, comparison mechanism 124 can compare execution results of simulation 132 executing on a host computer 102 with standalone code implementation 144 executing on a computing platform 160. Standalone code implementation 144 can be implemented in any programming language, such as C and Hardware Description Language (HDL). Communication control 126 can communicate between computing platform 160 and application 120 for data regarding standalone code implementation 144. Communication control 126 can issue instructions to cause simultaneous execution of simulation 132 and standalone code implementation 144 in a locked-step manner so that comparison mechanism 124 can make comparison during execution of simulation 132 and standalone code implementation 144. In one aspect of the present invention, application 120 uses model 136 to represent simulation 132 and model 138 to represent standalone code implementation 144. Model 136 and model 138 may be built using a block diagram modeling application, such as Simulink®. Communication control 126 can make a function call to standalone code implementation 144 via a block in model 138. Communication control 126 is also capable of controlling execution of standalone code implementation 144. In other words, communication control 126 can determine when to execute, pause, or terminate the execution of the standalone code implementation 144. Communication control 126 can also determine what inputs standalone code implementation 144 should use for execution. Communication control 126 can further determine if a portion or all of the standalone code implementation 144 should be executed. In a preferred embodiment of the present invention, a comparison model is automatically generated by comparison mechanism 124 to compare the simulation 132 and standalone code implementation 144. The comparison model may be implemented as a block diagram model, where one or more blocks are used to represent semantics of the simulation 132 and standalone code implementation 144.

In one aspect of the present invention, model 136 represents a design being simulated by simulation 132 and standalone code implementation 144 is automatically generated from the same design using specification information of computing platform 160, such as memory information, interface information, processing speed information of the computing platform 160. In this case, model 138 is used to represent the physical execution of standalone code implementation 144 on the computing platform 160, whereas model 136 represents a simulation of the design in a simulation environment, such as one provided by Simulink®. In one embodiment of the present invention, application 120 can automatically generate model 138. Application 120 or comparison mechanism 124 can automatically generate a comparison model to help illustrate the verification of the automatically generated standalone code implementation 144 against the design as simulated by simulation 132. Hence, the present invention provides an automatic method to verify the generated standalone code implementation 144 with the original design. The present invention also allows a user to specify how one wants to verify the automatically generated code with its original design (details later). One of ordinary skill in the art can appreciate that a user would generally like to know if the automatically generated standalone code implementation from the design behaves as predicted in the simulation simulating the design. Additionally, one of ordinary skill in the art will also appreciate that there is some discrepancy between the automatically generated code and the simulation due to many factors, such as design choices and quality of the automatically generated standalone code implementation, that a user would generally like to be able to compare the execution of the automatically generated standalone code implementation with the simulation to see how different the execution results are.

In a preferred embodiment of the present invention, model 138 is built using gateway blocks described in U.S. patent application Ser. No. 11/028,172, the content of which is incorporated herein by reference. In another embodiment of the present invention, the functionalities of the gateway block can be achieved by using the processor-in-the-loop (PIL) technology featured in Embedded Target for Motorola MPC555 from The MathWorks, Inc. of Natick, Mass. or TargetLink from dSPACE of Germany. One of ordinary skill in the art will appreciate that there are many different ways and technologies that can be used to achieve the purpose of a gateway block.

A gateway block can provide input to the standalone code implementation on the computing platform 160 and wait for the computing platform 160 to execute a portion of the standalone code implementation that is represented by the gateway block. Once the gateway block receives the output from the execution of the portion of the standalone code implementation that is represented by the gateway block, the gateway block can provide the received output as an input to another block in the block diagram model. The gateway block can carry out the steps above by using many different technologies, such as via APIs to the computing platform's debugger or IDE of the computing platform, and via direct interface device drivers to the computing platform (USB, JTAG, TCP/IP, RS-232). Additionally, a gateway block does not need to be a visible block in a block diagram model because the purpose of the use of the gateway block is to communicate with a computing platform external to the host computer.

When the standalone code implementation is implemented in HDL, model 138 can be automatically created using one or more gateway blocks or co-simulation blocks, such as ones from The MathWorks' product Link for ModelSim, to communicate with a computing platform executing standalone HDL code implementation.

In another embodiment of the present invention, comparison mechanism 124 can compare simulation 132' executing by application 140 with standalone code implementation 144 embedded on a computing platform 160. Communication control 126 can communicate with application 140 regarding data related to simulation 132' and also communicate with computing platform 160 regarding data related to standalone code implementation 144. Communication control 126 can issue instructions to cause simultaneous execution of simulation 132' and standalone code implementation 144 in a locked-step manner so that comparison mechanism 124 can make comparison during execution of simulation 132' and standalone code implementation 144. Comparison mechanism 124 can automatically generate a comparison model to compare the simulation 132' and standalone code implementation 144. The comparison model may be implemented as a block diagram model, where one or more blocks are used to represent semantics of the simulation 132' and standalone code implementation 144.

In still another embodiment of the present invention, comparison mechanism 124 can compare simulation 132" executing on host computer 150 with standalone code implementation 144 embedded on a target platform. Communication control 126 can communicate with application 140' regarding simulation 132" and communicate with computing platform 160 regarding standalone code implementation 144. Communication control 126 can issue instructions to cause simultaneous execution of simulation 132" and standalone code implementation 144 in a locked-step manner so that comparison mechanism 124 can make comparison during execution of simulation 132" and standalone code implementation 144. Comparison mechanism 124 can automatically generate a comparison model to compare the simulation 132" and standalone code implementation 144. The comparison model may be implemented as a block diagram model, where one or more blocks are used to represent semantics of the simulation 132" and standalone code implementation 144.

One of ordinary skill in the art will appreciate that, although the illustrated example only shows the standalone code implementation 144 being executed on a computing platform external to the host computer 102, the present invention can be equally applied to standalone code implementations executed on a computing platform internal to the host computer 102.

Figure 4:
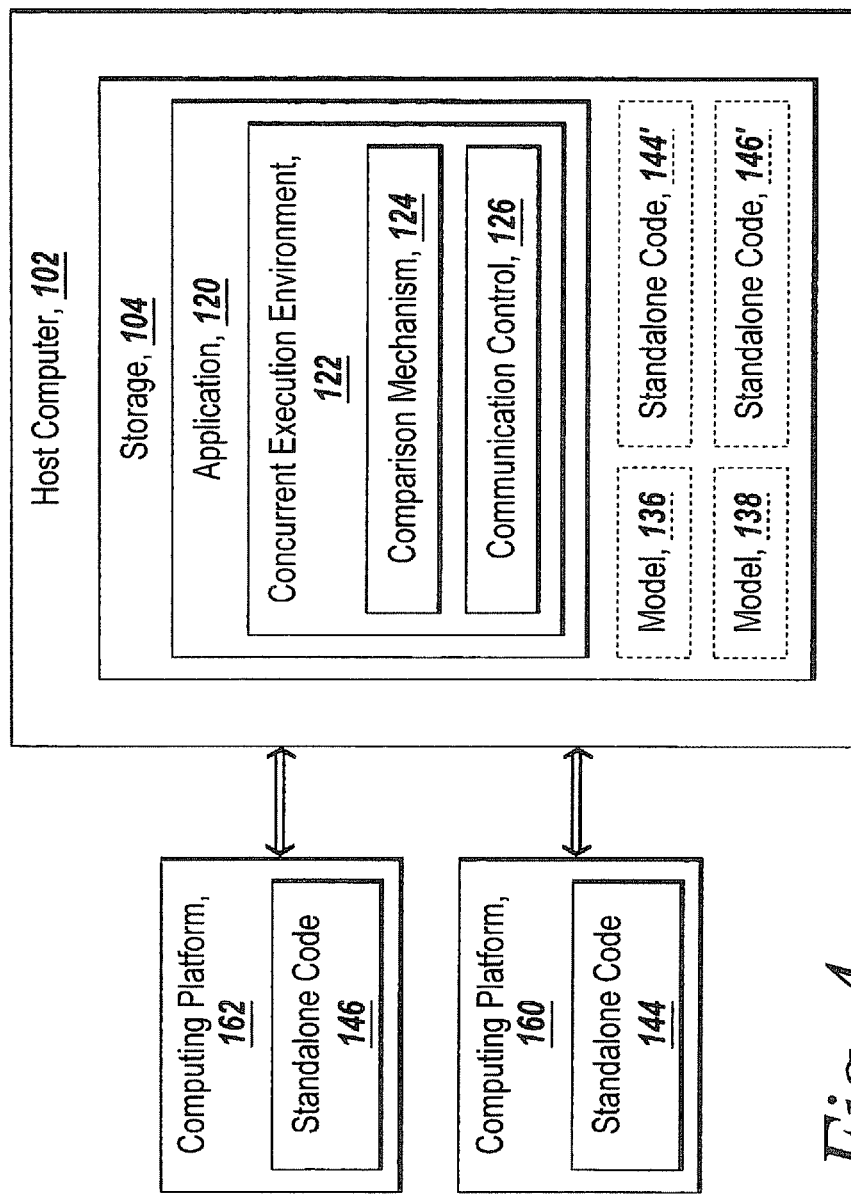
FIG. 4 illustrates a suitable system for practicing a further embodiment of the present invention.

FIG. 4 depicts an exemplary system that is suitable for practicing one embodiment of the present invention. Comparison mechanism 124 can compare standalone code implementation 144 and standalone code implementation 146 executed on computing platform 160 and computing platform 162, respectively. Standalone code implementations 144 and 146 can be implemented in any programming language, such as C and HDL. Communication control 126 can communicate with computing platform 162 regarding information for standalone code implementation 146. Communication control can also communicate with computing platform 160 regarding information for standalone code implementation 144. Communication control can issue instructions to cause simultaneous execution of standalone code implementation 144 and standalone code implementation 146 in a locked-step manner so that comparison mechanism 124 can make comparison during execution of standalone code implementation 144 and 146. In one embodiment of the present invention, application 120 uses model 136 to represent execution of standalone code implementation 144 on computing platform 160 and model 138 to present execution of standalone code implementation 146 on computing platform 162. In a preferred embodiment of the present invention model 136 and model 138 are built using a block diagram modeling application, such as Simulink®. Comparison mechanism 124 can automatically generate a comparison model to compare the standalone code implementation 146 and standalone code implementation 144. The comparison model may be implemented as a block diagram model, where one or more blocks are used to represent semantics of the standalone code implementations 144 and 146. Hence, the user can visualize the comparison of specific intermediate outputs and signals in the comparison model.

In another embodiment of the present invention, comparison mechanism 124 can compare standalone code implementation 144 executed on computing platform 160 with standalone code implementation 144' executed on host computer 102. Communication control 126 can issue instructions to cause simultaneous execution of standalone code implementation 144' and standalone code implementation 144 in a locked step manner so that comparison mechanism 124 can make comparison during execution of the standalone code implementation 144 and standalone code implementation 144'. Models can be used to represent the execution of the standalone code implementation under a certain environment. Comparison mechanism 124 can automatically generate a comparison model to compare the standalone code implementation 144' and standalone code implementation 144. The comparison model may be implemented as a block diagram model, where one or more blocks are used to represent semantics of the standalone code implementations 144 and 144'.

In a further embodiment of the present invention, comparison mechanism 124 can compare execution results of standalone code implementation 144' and standalone code implementation 146'. Standalone code implementation 144' and standalone code implementation 146' mayor may not be executed by the same processor or controlled by the same operating system. Communication control 126 can also issue instructions to cause simultaneous execution of the standalone code implementations 144' and 146' in a locked step manner so that comparison mechanism can make comparison during execution of the standalone code implementations 144' and 146'. Comparison mechanism 124 can automatically generate a comparison model to compare the standalone code implementation 146' and standalone code implementation 144'. The comparison model may be implemented as a block diagram model, where one or more blocks are used to represent semantics of the standalone code implementations 144' and 146'.

Once a user provides comparison instructions, comparison mechanism 124 can compare execution of two different standalone code implementations on the same type of computing platforms. In another embodiment of the present invention, comparison mechanism 124 can obtain comparison instructions from a specific location in the storage. Comparison mechanism 124 can also compare execution of the same standalone code implementations on different types of computing platforms. The present invention also allows comparison mechanism 124 to compare execution of different standalone code implementations on different types of computing platforms. Furthermore, the present invention can also compare execution of one standalone code implementation on an external computing platform with another standalone code implementation on an internal computing platform on the host computer. Additionally, the present invention also enables comparison of execution of two standalone code implementations on the same computing device.

Figure 5:
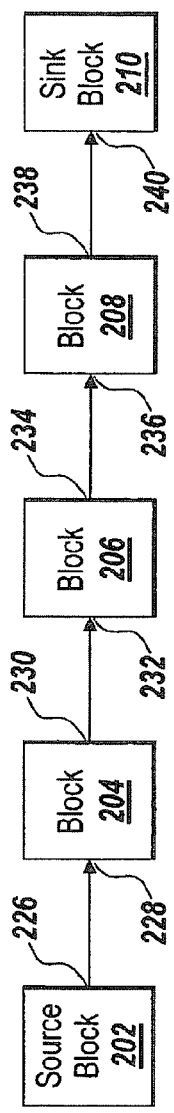
FIG. 5 illustrates a block diagram model for a simulation that is suitable to practice with the present invention.
Figure 6:
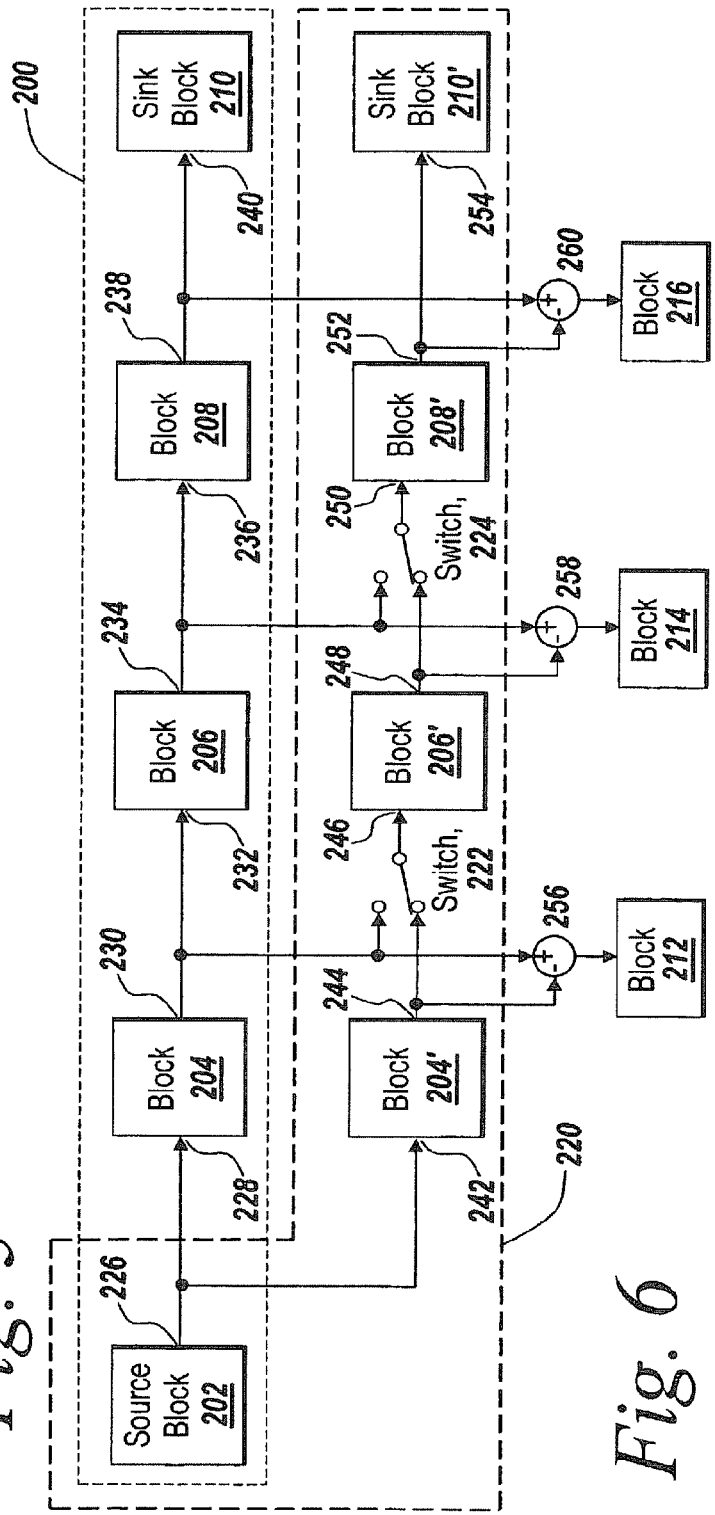
FIG. 6 illustrates a comparison between two implementations.

FIG. 5 and FIG. 6 provide an exemplary implementation of the present invention as depicted in FIG. 3. FIG. 5 illustrates a block diagram model representing an implementation 200 of a design implemented using a block diagram modeling application, such as Simulink®. Block 202 is a source block that provides input signals to the entire implementation 200. Block 202 has an output port 226 where a signal exits block 202 and enters block 204 via input port 228. Block 204 has an output port 230 where a signal exits block 204 and enters block 206 via input port 232. Signals from block 206 exit from output port 234 and feed into block 208 via input port 236. Block 208 has output port 238 where a signal exits and enters block 210 via input port 240. Block 210 is a sink block having no output ports. Implementation 200 can be stored in storage 104 and executed on the host computer 102. Outputs from blocks 204, 206, and 208 are considered as intermediate outputs of implementation 200. One of ordinary skill in the art will appreciate that implementation 200 can have any number of blocks and the blocks does not need to be in series. Blocks 204, 206, and 208 can be, but are not limited to, a filter block, a transform block, a custom block, a subsystem, or other types of blocks provided by Simulink®.

FIG. 6 illustrates a comparison/verification model that compares implementation 200 with implementation 220. Implementation 200 includes exactly the same blocks as the block diagram model shown in FIG. 5. Implementation 220 can be the execution of standalone code implementation 144 on the computing platform 160. One of ordinary skill in the art will appreciate that model implementation 220 can also be the execution of several standalone code implementations on the same or different computing platforms. Implementation 220 is represented using one or more blocks in the comparison/verification model. The comparison/verification model can be stored in storage 104. Communication control 126 can pass instructions from the host computer 102 to computing platform 160 to execute standalone code implementation 144 in a certain way and retrieves execution results of the standalone code implementation 144 from the computing platform 160 and communicate the execution results back to host computer 102. Implementation 220 uses the same source block 202 as implementation 200 so that both implementations use the same input signals. Alternatively, a user can choose to use different input signals for implementation 200 and implementation 220. Additionally, input signals may also be generated using one or more external input devices.

Implementation 220 includes block 204' that receives input signals from block 202 via input port 242 and outputs signals to output port 244. Block 204' can represent execution of a portion of standalone code implementation 144 on the computing platform 160. Furthermore, block 204' can represent execution of a function of the standalone code implementation 144 on the computing platform 160. Communication control 126 can make a function call via block 204' to computing platform 160. For example, block 204' can be a gateway block that is described in the U.S. patent application Ser. No. 11/028,172, which is incorporated herein by reference in its entirety. Alternatively, real-time data transfer such as Texas Instruments Real-Time Data Exchange (RTDX), processor in the loop (PIL), or hardware in the loop (HIL) technology may be used by communication control 126 to communicate with computing platform 160 to implement a gateway block. In another embodiment of the present invention, the gateway block can be built using the PIL technology featured in Embedded Target for Motorola MPC555 from Math Works of Natick, Mass., or TargetLink from dSPACE of Germany. One of ordinary skill in the art will appreciate that there are many technologies that can be used to construct a gateway block that is suitable to use in the present invention. In another embodiment of the present invention, block 204' can be a co-simulation block, such as one from The MathWorks' product Link for ModelSim, to communicate between the host computer and the computing platform that executes the standalone code implementation.

In one embodiment of the present invention, block 204' can be viewed as the equivalent of block 204 that is in the standalone code implementation 144. A user can choose to compare output signals from block 204 with output signals from block 204'. Hence block 204' is the part of the standalone code implementation 144 that the user wishes to compare with block 204. A user can use a difference block 256 to compare the output signals from blocks 204 and 204'. Difference block 256 takes the output signals of block 204' and subtracts the output signals of block 204. The output of the difference block 256 can then be supplied to sink block 212.

Implementation 220 also includes block 206' that receives signals via input port 246. Switch 222 can be provided to choose between output signals from block 204 and the ones from block 204'. Hence, a user can choose if block 206' will have the same inputs as block 206 to prevent error propagation from one block to another. On the other hand, a user might want to know the cumulative error in the implementation 220 relative to implementation 200 so that in this case, the user would want to use output signals from block 204' to feed into block 206'. Block 206' has an output port 248 where a signal exits block 206'. Again, a user can choose to compare output signals from block 206 and block 206' via a difference block 258. Difference block 258 takes the output signals from block 206' and subtracts the ones from block 206. The results from the difference block 258 are then inputted to sink block 214. Switch 224 allows a user to choose an input signal to block 208' via input port 250. If switch 224 is used to choose output signals from block 206, then block 208' will have the same input signals as block 208. Alternatively, if switch 224 is used to choose output signals from block 206', then errors in the output signals of block 206' are included as part of the input signals into block 208'. Block 208' output signals via output port 252 and the signals are inputted to sink block 210' via its input port 254. Output signals from block 208 and block 208' are compared using difference block 260 and the output from the difference block 260 is then inputted into block 216. Outputs from blocks 204', 206' and 208' are considered as intermediate outputs of the implementation 220 as they are not inputs or the final outputs of the implementation 220. Hence the present invention provides a method and a system to compare intermediate outputs of different implementations.

One of ordinary skill in the art will appreciate that there are many ways to compare two signals and difference blocks 256, 258, and 260 are merely examples. Additionally, a user can choose if he wants to compare signals at every block, such as shown in FIG. 6, or only at specific blocks. Furthermore, a user can also choose to compare outputs from two models, where each model can include more than one smaller model. If implementation 200 is used to generate code to embed in computing platform 160 and implementation 220 is used to represent the execution of the generated code on the target platform, then the comparison/verification model can be automatically generated and the user just needs to specify which signals that the user wishes to compare. One of ordinary skill in the art will further appreciate that the comparison/verification model shown in FIG. 6 can also be used in systems such as shown in FIG. 2 and FIG. 4. When implementation 220 is automatically generated from a design that implementation 200 simulates, then the comparison/verification model can be automatically generated. Otherwise, a user may need to define what each block is corresponding to so that the user can choose later what signals from what blocks the user wishes to compare.

Block 204', block 206', block 208' and block 210' can be implemented as gateway blocks as described in the U.S. patent application Ser. No. 11/028,172. A gateway block may transmit and receive data for exchange between the application 120 and the computing platform 160. A gateway block can contain discrete components capable of accomplishing a variety of tasks. For example, the gateway block can include a component for use in passing the input data and parameters of a function to be executed to the external processor, a component for use in executing the function, and a component which retrieves the intermediate outputs from the target platform. Using a plurality of discrete components designed for accomplishing individual tasks, the interaction between the application 120 and the computing platform 160 can be separated. In one embodiment of the present invention, a communication channel can be set up by the gateway block or the application 120 to communicate with computing platform 160. An application program interface (API) containing a set of routines and protocols necessary for initialing control and data transfer communications to the target platform can be used. By invoking the API, individual functions of the processor in the external environment can be called with input data and parameters provided from the model environment for use in the processor environment. Additionally, with the API, several functions residing on the computing platform 160 can be called. Furthermore, for each target platform or external processor, using the API the application 120 can manage all context switching associated with calling the function, such as saving and restoring context, setting the program counter, setting a breakpoint at the end of the called function, and executing standalone code implementation on the target platform or external processor. After the function has executed, the API can be used in retrieving the output data via the communication channel for use in the block diagram model.

One of ordinary skill in the art will appreciate that although blocks 204',206', 208' and 210' have been described to communicate with the same target platform, blocks in one model can communicate with different target platforms or external processors. The combination of the different target platforms and/or external processors can be viewed as one big system that communicates with one model. One of ordinary skill in the art will also appreciate that FIGS. 5 and 6 are merely exemplary block diagram models that can be used to practice with the present invention, and other graphical models or textual models can also be used to practice with the present invention.

Figure 7:
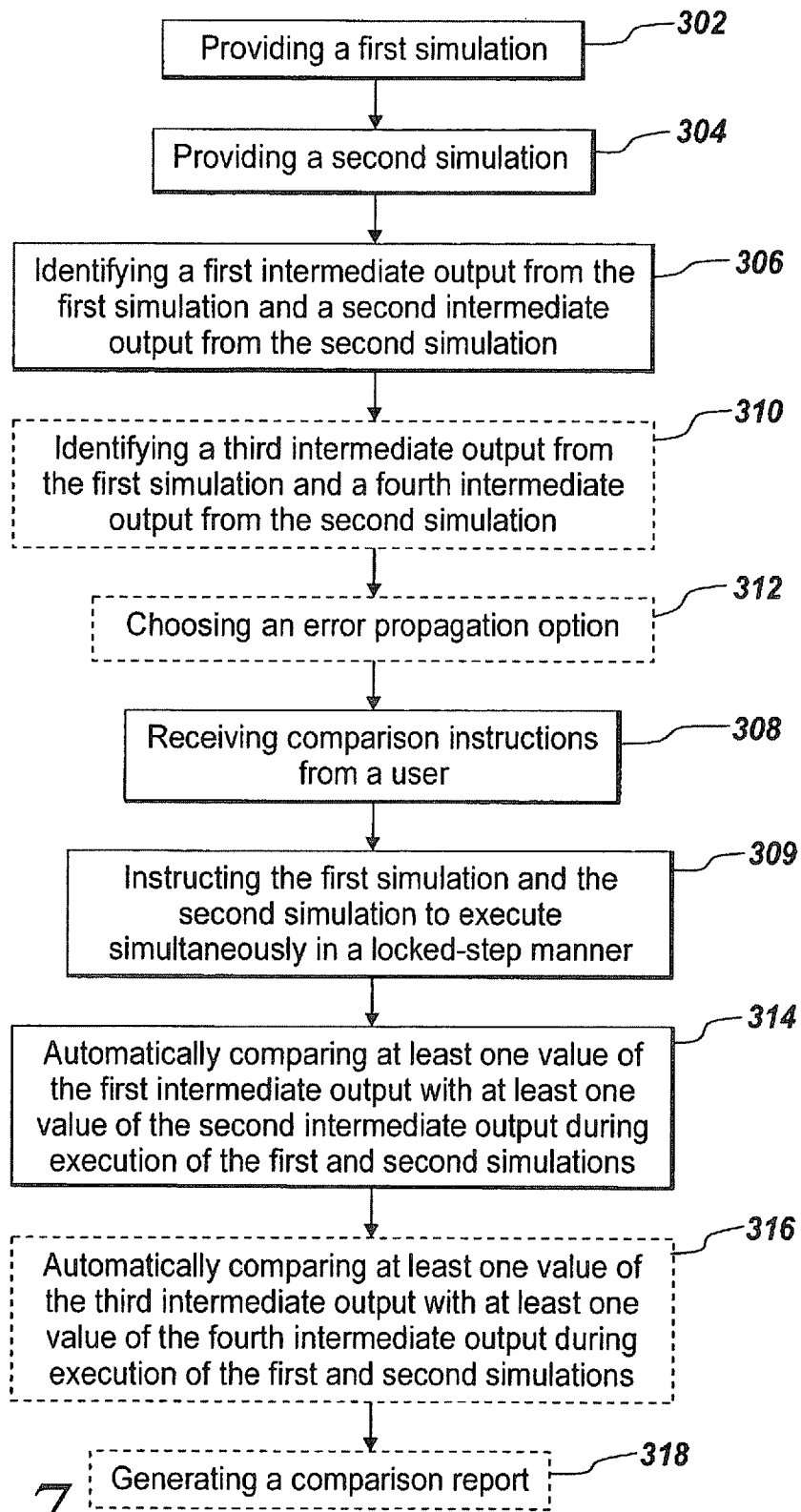
FIG. 7 is a flowchart depicting the steps taken to practice an embodiment of the present invention corresponding to the system illustrated in FIG. 2.

FIG. 7 illustrates a flow chart depicting steps taken to practice one embodiment of the present invention according to the system shown in FIG. 2. At step 302, a first simulation is provided to application 120. A second simulation is then provided to application 120 at step 304. The first and second simulations mayor may not be executed by the same application or on the same host computer. Communication control 126 can communicate with an external application (not application 120) if the external application is executing on a host computer that is not the one that executes application 120. A user then identifies a first intermediate output from the first simulation and a second intermediate output from the second simulation in step 306. A user may optionally identify more intermediate outputs for comparison, such as a third intermediate output from the first simulation and a fourth intermediate output from the second simulation in step 310. A user may then choose an error propagation option in step 312. For example, in FIG. 6, a switch is used to provide the user the option to choose if the user wants to accumulate errors from the earlier execution portions or previous block. Comparison instructions are received from a user in step 308. The comparison instructions may specify, but not limited to, number of test runs (per input source, tuned parameter, data routing configuration), range of system input sources, range of subsystem-level design parameter values, range of independent subsystem-level error tolerances, range of accumulated subsystem-level error tolerances, and range of reporting metrics and formats, Comparison mechanism 124 will use the comparison instructions provided by the user to make comparisons between intermediate outputs. In step 309, the first simulation and the second simulation are simultaneously executed in a locked-step manner. In step 314, at least one value of the first intermediate output and at least one value of the second intermediate output are automatically compared during execution of the first and second simulations. Other identified intermediate outputs will also be automatically compared during execution of the first and second simulations, such as in step 316, at least one value of the third intermediate output and at least one value of the fourth intermediate output are automatically compared.

Lastly, a comparison report can be generated in step 318. The report can include statistics that include, but not limited to, error rates, error distribution, and sensitivity. Error rates can be any commonly used error rate or ally user-defined error rate, such as mean time before error, mean time between errors, errors per unit time, and errors per run. Error distribution can include a commonly used distribution, or any user-defined distribution, such as a probability distribution function and a probability density function. Sensitivity can include, but not limited to, independent subsystem-level sensitivity to subsystem input, accumulated subsystem-level sensitivity to application input, independent subsystem-level sensitivity to subsystem parameters, and accumulated subsystem-level sensitivity to parameters. Commonly used statistic tools may be included as part of the application 120. Application 120 can also provide mechanisms so that a user can use a custom defined function implemented in a technical computing application, such as MATLAB®, to calculate a user defined error rate, user defined error distribution, or user defined sensitivity. The report may also include statistics that include percentage of occurrences in which differences in value of two intermediate outputs are greater than a user-defined tolerance. The report may additionally include figures, such as plots of differences as a function of time, bar graphs showing sensitivity metrics of different intermediate outputs, pi charts showing percentage of error contribution factors.

Figure 8:
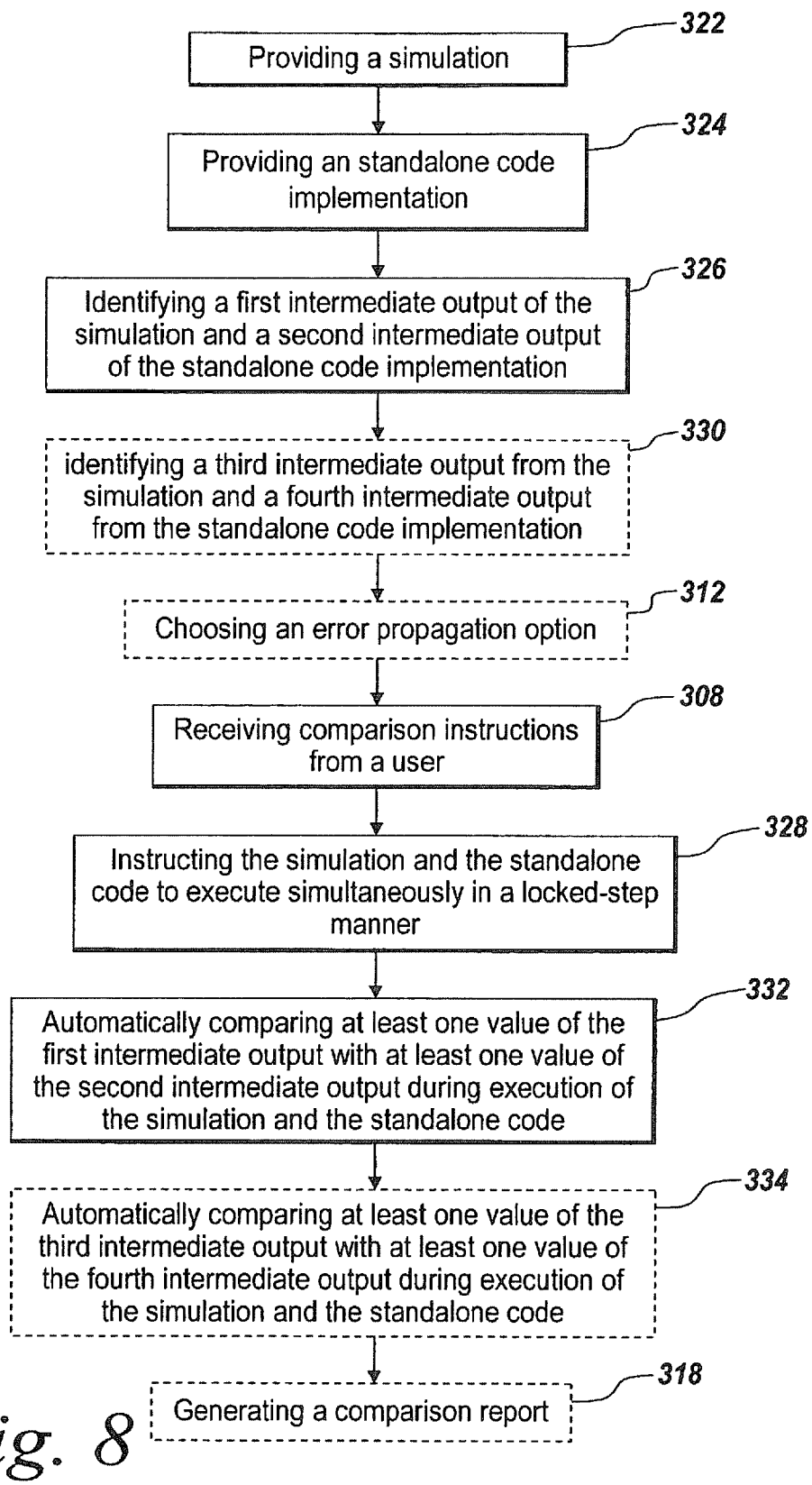
FIG. 8 is a flowchart depicting the steps taken to practice another embodiment of the present invention corresponding to the system illustrated in FIG. 3.

FIG. 8 depicts a flowchart illustrating steps taken to practice one embodiment of the present invention according to the system shown in FIG. 3. In step 322, a simulation is provided to application 120. A standalone code implementation in then provided in step 324. In one embodiment of the present invention, the standalone code implementation is automatically generated from a design using information regarding the computing platform, where the design is simulated by the simulation. The simulation mayor may not be executed by the application 120. Communication control 126 can communicate with an external application (not application 120) if the simulation is executed on a host computer that does not execute application 120. Communication control 126 can also communicate with the computing platform executing the standalone code implementation. A first intermediate output in the simulation and a second intermediate output in the standalone code implementation are identified in step 326. A user may additional identify other intermediate outputs for comparison, such as in step 330, a third intermediate output from the simulation and a fourth intermediate output from the standalone code implementation are identified for comparison. A user may further choose an error propagation option in step 312. After receiving comparison instructions from a user in step 308, the simulation on a host computer and the standalone code implementation on the computing platform are then simultaneously executed in a locked-step manner in step 328. Comparison mechanism 124 uses the received comparison instruction information as guidelines for comparing intermediate outputs. In step 332, at least one value of the first intermediate output and at least one value of the second intermediate output are automatically compared during execution of the simulation and the standalone code implementation. If other intermediate outputs were identified previously for comparison, they would also be automatically compared during execution of the simulation and the standalone code implementation, such as in step 334, at least one value of the third intermediate output with at least one value of the fourth intermediate output are automatically compared during execution of the simulation and the standalone code implementation. Lastly, a comparison report can be generated in step 318.

Figure 9:
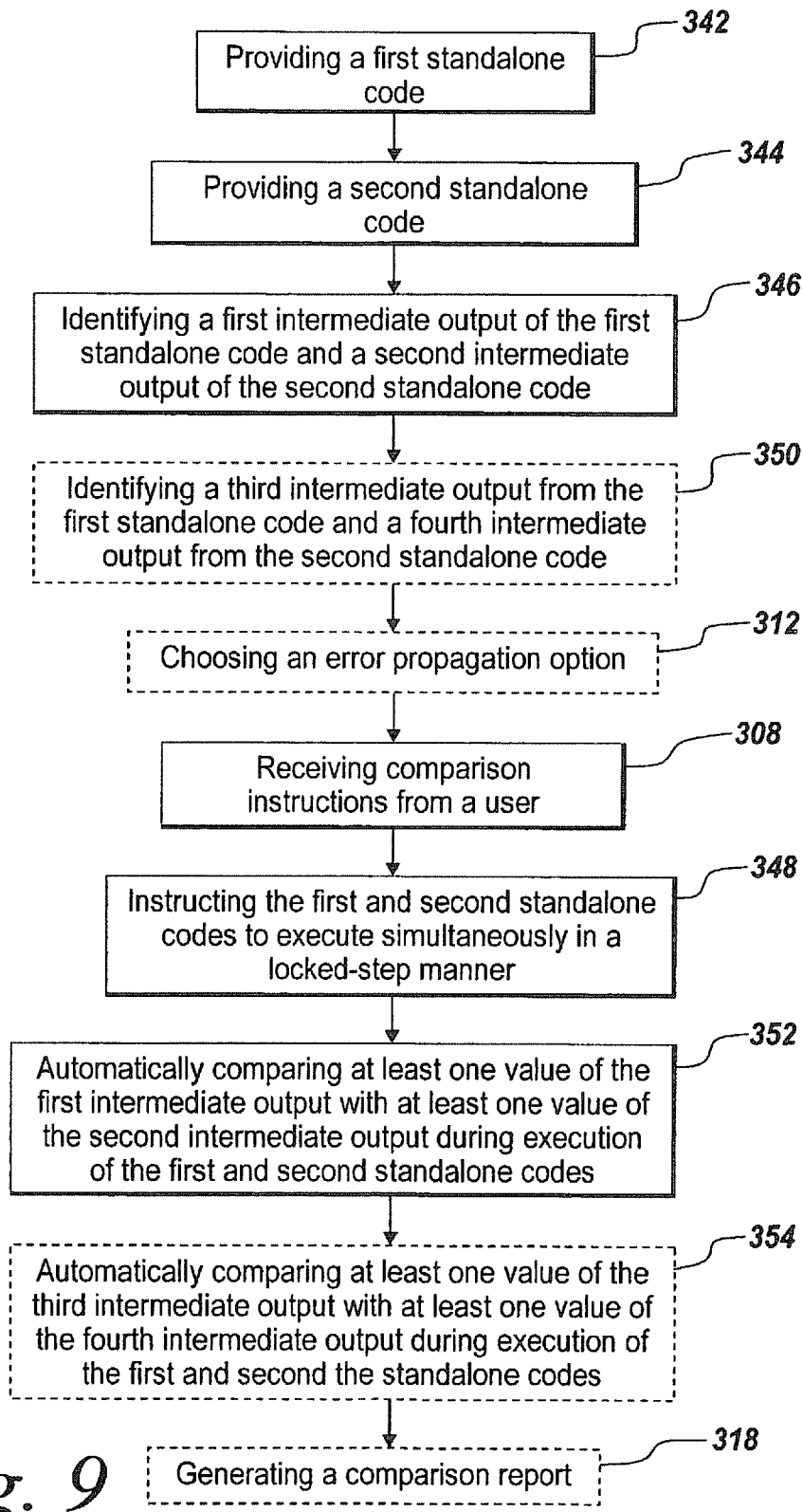
FIG. 9 is a flowchart depicting the steps taken to practice a further embodiment of the present invention corresponding to the system illustrated in FIG. 4.

FIG. 9 depicts a flowchart illustrating steps taken to practice one embodiment of the present invention according to the system shown in FIG. 4. In step 342, a first standalone code implementation is provided. A second standalone code implementation is provided in step 344. Communication control 126 is responsible for communicating with the one or more computing platform that executes the first or second standalone code implementation. In step 346, a first intermediate output in the first standalone code implementation and a second intermediate output in the second standalone code implementation are identified for comparison. A user may choose to identify more intermediate outputs for comparison, such as in step 350, a third intermediate output from the first standalone code implementation and a fourth intermediate output from the second standalone code implementation are identified for comparison. A user may also additional choose an error propagation option in step 312. Comparison mechanism 124 receives in step 308 comparison instructions from a user. Comparisons between intermediate outputs will be made according to the comparison instructions. In step 348, the first and second standalone code implementations are executed simultaneously in a locked-step manner. At least one value of the first intermediate output with at least one value of the second intermediate output are automatically compared during execution of the first and second standalone code implementations in step 352. If other intermediate outputs were previously identified, they would also be automatically compared, such as in. step 354, at least one value of the third value with at least one value of the fourth intermediate output are automatically compared during execution of the first and second standalone code implementations. Lastly, a comparison report can be generated in step 318.

The present invention provides a method for comparing and/or verifying by a user using user-defined information and/or rules. Reports can also be automatically generated using user-defined information and/or rules. The present invention relieves the user the burden to write manual code to compare two implementations. The present invention also relieves the user the burden to write manual code to communicate with an external computing platform to send instructions and retrieve execution data. The present invention allows easy verification between original design and the automatically generated standalone code implementation from the original design. The present invention also allows easy comparisons among a number of different simulations and/or standalone code implementations, such as multiple implementation techniques for a given computing platform, multiple automatically generated standalone code implementations from one design for multiple different computing platforms, simulations of a design with different optimization techniques, simulations of a design using different combinations of computing platforms.

Many alterations and modifications may be made by those having ordinary skill in the art without departing from the spirit and scope of the invention. Therefore, it must be expressly understood that the illustrated embodiments have been shown only for the purposes of example and should not be taken as limiting the invention, which is defined by the following claims. These claims are to be read as including what they set forth literally and also those equivalent elements which are insubstantially different, even though not identical in other respects to what is shown and described in the above illustrations.

We claim:

1. A method comprising:
   automatically generating, by a processor of a host computer, an executable comparison block diagram model including:
      a first portion that represents a first simulation as a plurality of interconnected graphical blocks, outputs of at least some of the interconnected graphical blocks of the first portion representing intermediate outputs in the first simulation, and
      a second portion that represents a second simulation as a plurality of interconnected graphical blocks, outputs of at least some of the interconnected graphical blocks of the second portion representing intermediate outputs in the second simulation, where
         the first and second simulations represent different implementations of a design, and
         the first and second simulations are configured for independent execution;
   storing the executable comparison block diagram in a memory;
   identifying for comparison, with a difference block in the comparison block diagram model, a first intermediate output from the first simulation and a second intermediate output from the second simulation, the difference block being separate from the first and second portions that represent the first and second simulations;

providing a switching capability at the second portion of the executable comparison block diagram model, the switching capability controlling whether a next component of the second portion of the executable comparison block diagram model receives:
the first intermediate output of the first simulation, or
the second intermediate output, where
the next component of the second portion of the executable comparison block diagram model is relative to the second intermediate output in an execution order;
instructing the first simulation and the second simulation to execute simultaneously in a locked-step manner during execution of the comparison block diagram model;
automatically comparing, by the processor, at least one value of the first intermediate output with at least one value of the second intermediate output during the execution of the comparison block diagram model including the first and second portions that represent the first and second simulations; and
generating a report comparing the first simulation with the second simulation.

2. The method of claim 1 further comprising:
executing the first simulation and the second simulation on different host computers.

3. The method of claim 1 further comprising:
identifying a third intermediate output from the first simulation and a fourth intermediate output from the second simulation; and
comparing at least one value of the third intermediate output with at least one value of the fourth intermediate output during execution of the first and second simulations.

4. The method of claim 3, wherein the third intermediate output is an output of a first block using the first intermediate output as an input, and the fourth intermediate output is an output of a second block using either the second intermediate output or the first intermediate output as an input.

5. The method of claim 1 further comprising:
receiving comparison instructions specifying at least one or a combination of the following: a number of test runs, a range of system input sources, a range of subsystem-level design parameter values, a range of independent subsystem-level error tolerances, a range of accumulated subsystem-level error tolerances, and a range of reporting metrics and formats.

6. The method of claim 1, wherein the report includes statistics on at least one or a combination of: an error rate, an error distribution, and a sensitivity metric.

7. The method of claim 6, wherein the error rate is at least one or a combination of: a mean time before error, a mean time between errors, a rate of error per time, and a rate of error per run.

8. The method of claim 6, wherein the sensitivity metric comprises at least one or a combination of an independent subsystem level sensitivity to subsystem input and an independent subsystem-level sensitivity to subsystem parameters.

9. The method of claim 1, wherein the first portion represents semantics of the first simulation and the second portion represent semantics of the second simulation.

10. A non-transitory computer-readable medium storing instructions executable by one or more computing devices, the instructions comprising instructions for:
generating automatically an executable comparison block diagram model including:
a first portion that represents a first simulation as a plurality of interconnected graphical blocks, outputs of at least some of the interconnected graphical blocks of the first portion representing intermediate outputs in the first simulation, and
a second portion that represents a second simulation as a plurality of interconnected graphical blocks, outputs of at least some of the interconnected graphical blocks of the second portion representing intermediate outputs in the second simulation, where
the first and second simulations represent different implementations of a design, and
the first and second simulations are configured for independent execution;
storing the comparison block diagram model in a memory;
identifying for comparison, with a difference block in the comparison block diagram model, a first intermediate output from the first simulation and a second intermediate output from the second simulation, the difference block being separate from the first and second portions that represent the first and second simulations;
providing a switching capability at the second portion of the executable comparison block diagram model, the switching capability controlling whether a next component of the second portion of the executable comparison block diagram model receives:
the first intermediate output of the first simulation, or
the second intermediate output, where
the next component of the second portion of the executable comparison block diagram model is relative to the second intermediate output in an execution order;
instructing the first simulation and the second simulation to execute simultaneously in a locked-step manner during execution of the comparison block diagram model;
automatically comparing at least one value of the first intermediate output from the first simulation with at least one value of the second intermediate output from the second simulation during execution of the comparison block diagram model including the first and second portions representing the first and second simulations; and
providing an output to a user comparing the first simulation with the second simulation.

11. The medium of claim 10 further comprising instructions for:
executing the first simulation and the second simulation on different host computers.

12. The medium of claim 10 further comprising instructions for:
identifying a third intermediate output from the first simulation and a fourth intermediate output from the second simulation; and
comparing at least one value of the third intermediate output with at least one value of the fourth intermediate output during execution of the first and second simulations.

13. The medium of claim 12, wherein the third intermediate output is an output of a first block using the first intermediate output as an input, and the fourth intermediate output is an output of a second block using either the second intermediate output or the first intermediate output as an input.

14. The medium of claim 10 further comprising instructions for:
receiving comparison instructions specifying at least one or a combination of the following: a number of test runs, a range of system input sources, a range of subsystem-level design parameter values, a range of independent subsystem-level error tolerances, a range of accumulated subsystem-level error tolerances, and a range of reporting metrics and formats.

15. The medium of claim 10 wherein the output is a comparison report comparing the first simulation with the second simulation.

16. The medium of claim 15, wherein the comparison report includes statistics on at least one or a combination of: an error rate, an error distribution, and a sensitivity metric.

17. The medium of claim 16, wherein the error rate is at least one or a combination of:
a mean time before error, a mean time between errors, a rate of error per time, and a rate of error per run.

18. The medium of claim 16, wherein the sensitivity metric comprises at least one or a combination of an independent subsystem level sensitivity to subsystem input and an independent subsystem-level sensitivity to subsystem parameters.

19. The medium of claim 10 wherein the first portion represents semantics of the first simulation and the second portion represents semantics of the second simulation.

20. An apparatus comprising:
an output device; and
one or more processors coupled to the output device, the one or more processors configured to:
   automatically generate an executable comparison model including:
      a first portion that represents a first simulation as a plurality of blocks, outputs of at least some of the blocks of the first portion representing intermediate outputs in the first simulation, and
      a second portion that represents a second simulation as a plurality of blocks, outputs of at least some of the blocks of the second portion representing intermediate outputs in the second simulation, where
         the first and second simulations represent different implementations of a design, and
         the first and second simulations are configured for independent execution,
   identify for comparison a first intermediate output from the first simulation and a second intermediate output from the second simulation for comparison based on a particular block being interconnected to the first intermediate output and the second intermediate output,
   provide a switching capability at the second portion of the executable comparison model, the switching capability controlling whether a next component of the second portion of the executable comparison model receives:
      the first intermediate output of the first simulation, or
      the second intermediate output, where
         the next component of the second portion of the executable comparison model is relative to the second intermediate output in an execution order;
   execute the first simulation and the second simulation simultaneously in a locked-step manner during execution of the comparison model, the execute including
      comparing at least one value of the first intermediate output from the first simulation with at least one value of the second intermediate output from the second simulation, the compare performed by a difference block of the comparison model that is separate from the first and second portions that represent the first and second simulations; and
   generate, on the output device, a report that compares the first simulation with the second simulation.

21. The apparatus of claim 20 wherein the one or more processors are further configured to:
execute the first simulation and the second simulation on different host computers.

22. The apparatus of claim 20 wherein the one or more processors are further configured to:
identify a third intermediate output from the first simulation and a fourth intermediate output from the second simulation; and
compare at least one value of the third intermediate output with at least one value of the fourth intermediate output during execution of the first and second simulations.

23. The apparatus of claim 22, wherein the third intermediate output is an output of a first block using the first intermediate output as an input, and the fourth intermediate output is an output of a second block using either the second intermediate output or the first intermediate output as an input.

24. The apparatus of claim 20 wherein the one or more processors are further configured to:
receive comparison instructions specifying at least one or a combination of the following: a number of test runs, a range of system input sources, a range of subsystem-level design parameter values, a range of independent subsystem-level error tolerances, a range of accumulated subsystem-level error tolerances, and a range of reporting metrics and formats.

25. The apparatus of claim 20 wherein the report compares the first simulation with the second simulation.

26. The apparatus of claim 20, wherein the report includes statistics on at least one or a combination of: an error rate, an error distribution, and a sensitivity metric.

27. The apparatus of claim 26, wherein the error rate is at least one or a combination of:
a mean time before error, a mean time between errors, a rate of error per time, and a rate of error per run.

28. The apparatus of claim 26, wherein the sensitivity metric comprises at least one or a combination of an independent subsystem level sensitivity to subsystem input and an independent subsystem-level sensitivity to subsystem parameters.

29. The apparatus of claim 20 wherein the first portion represents semantics of the first simulation and the second portion represents semantics of the second simulation.

* * * * *